United States Patent
Kim et al.

(10) Patent No.: US 7,282,859 B2
(45) Date of Patent: Oct. 16, 2007

(54) PLASMA DISPLAY APPARATUS HAVING HEAT RADIATION SHEET

(75) Inventors: Ki-Jung Kim, Cheonan-si (KR); Tae-Kyoung Kang, Asan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/938,636

(22) Filed: Sep. 13, 2004

(65) Prior Publication Data

US 2005/0062382 A1 Mar. 24, 2005

(30) Foreign Application Priority Data

Sep. 24, 2003 (KR) .................. 10-2003-0066316

(51) Int. Cl.
*H01J 17/49* (2006.01)

(52) U.S. Cl. .............. 313/582; 313/583; 313/584; 313/586; 361/681

(58) Field of Classification Search .......... 165/185, 165/168–170; 313/582–587, 537, 44–46; 445/15, 22, 24; 345/37, 41, 60; 315/169.1, 315/0.4; 349/56, 58, 149, 158, 161; 348/787–789, 348/836; 361/200, 681, 694, 704, 688
See application file for complete search history.

(56) References Cited

U.S. PATENT DOCUMENTS

| | | | | |
|---|---|---|---|---|
| 5,971,566 A | * | 10/1999 | Tani et al. .................. 362/294 |
| 6,346,334 B1 | * | 2/2002 | Kamitani .................... 428/521 |
| 6,409,562 B1 | * | 6/2002 | Asano et al. .................. 445/2 |
| 6,433,489 B1 | * | 8/2002 | Tanaka et al. ........... 315/169.4 |
| 2002/0006051 A1 | * | 1/2002 | Yano et al. .................. 365/111 |
| 2003/0103019 A1 | | 6/2003 | Rhee |
| 2004/0257307 A1 | * | 12/2004 | Bae et al. ..................... 345/60 |
| 2005/0077835 A1 | * | 4/2005 | Kim ........................ 315/169.4 |

FOREIGN PATENT DOCUMENTS

| | | |
|---|---|---|
| JP | 10-40823 | 2/1998 |
| JP | 2000-219852 | 8/2000 |
| JP | 2001-242794 | 9/2001 |
| JP | 2002-196684 | 7/2002 |
| JP | 2002-202729 | 7/2002 |
| JP | 2002-277185 | 9/2002 |
| JP | 2003-162228 | 6/2003 |
| JP | 2003-216054 | 7/2003 |

OTHER PUBLICATIONS

Japanese Office action for Japanese patent application No. 2004-205550 issued on Oct. 17, 2006.
Japanese Office action for Japanese patent application No. 2004-205550, issued on Jun. 5, 2007.

* cited by examiner

*Primary Examiner*—Joseph Williams
*Assistant Examiner*—Hana Asmat Sanei
(74) *Attorney, Agent, or Firm*—Robert E. Bushnell, Esq.

(57) ABSTRACT

A plasma display apparatus includes a heat radiation sheet that is easily attached and separated to and from a plasma display panel, has strengthened adherence with the plasma display panel and a chassis base, and does not generate a residual image. The plasma display apparatus includes a heat radiation sheet between a plasma display panel and a chassis base, and the heat radiation sheet is divided into two or more sheets, where the gap between the sheets is small enough so that a visible residual image does not appear.

20 Claims, 4 Drawing Sheets

PLASMA DISPLAY APPARATUS HAVING HEAT RADIATION SHEET

CLAIM OF PRIORITY

This application makes reference to, incorporates the same herein, and claims all benefits accruing under 35 U.S.C. §119 from an application for PLASMA DISPLAY APPARATUS HAVING HEAT RADIATION SHEET earlier filed in the Korean Intellectual Property Office on 24 Sep. 2003 and there duly assigned Ser. No. 2003-66316.

BACKGROUND OF THE INVENTION

1. Field of the Invention

The present invention relates to a plasma display apparatus, and more particularly, to a plasma display apparatus including a heat radiation sheet that both prevents visible residual images from forming while allowing for easy attachment and detachment of the heat radiation sheet to and from a plasma display panel (PDP).

2. Description of the Related Art

In general, a plasma display apparatus is an apparatus for displaying an image through a gas discharging phenomenon, and can replace a cathode ray tube (CRT) device due to excellent display features such as display capacity, brightness, contrast, residual image, and viewing angle. In the plasma display apparatus, a gas filled between electrodes is discharged by direct current (DC) voltage or alternating current (AC) voltage applied to the electrodes, and accordingly, ultraviolet rays are radiated to excite a phosphor and emit visible light.

A plasma display panel (PDP) included in the plasma display apparatus can be classified into an AC type and a DC type according to a discharging mechanism. In the DC type plasma display panel, electrodes included in the plasma display panel are directly exposed to a discharge gas filled in a discharging cell, and the voltage applied to the electrodes is directly applied to the discharge gas. In the AC type plasma display panel, since the electrodes are separated from the discharge gas by a dielectric layer, charged particles generated in a discharging operation are not absorbed by the electrodes, a wall charge is formed, and the discharging operation occurs using the wall charge. Therefore, since the plasma display apparatus uses the discharging operation for displaying images, the plasma display panel generates a lot of heat.

The plasma display panel is mounted in an external case with a circuit device. The panel is coupled to a chassis base, and the chassis base is coupled to the external case. The chassis base is manufactured using a thermal conductive metal substance so that the heat of the panel can be drawn out from the panel. A heat radiation sheet is disposed between the chassis base and the panel in order to promote the radiation of heat toward the chassis base.

The heat radiation sheet used to remove the heat generated on the plasma display panel can be manufactured using various materials, and includes a thermal conductive filler such as copper powder, graphite powder, and aluminum powder.

However, the conventional heat-radiation sheet has a low thermal conductive coefficient of about 1 W/m·K, thus decreasing a heat radiating function. When heat is not effectively drawn away from the plasma display panel, the brightness of the PDP is lowered in the discharging cell, where much heat accumulates. Accordingly, this causes a difference between the brightnesses of a cell that emits light and a cell that does not emit light, and an entire brightness of the plasma display panel is lowered. Moreover, when the discharging strength increases in order to improve the brightness of the plasma display apparatus, more heat is generated from the plasma display panel, thus aggravating the above problem.

Therefore, a highly thermal conductive heat radiation sheet that is manufactured using highly oriented graphite is used recently in order to improve the heat conductive function. However, the coupling forces between particles in the highly thermal-conductive sheet are weak and the highly thermal-conductive sheet is less flexible, thus generating dust and being brittle and thus prone to fracturing in a bending process. Moreover, when the heat radiation sheet is separated from the plasma display panel to repair the panel, some of the heat radiation sheet adhered to the display panel surface may not be removed, thus requiring additional manual work.

As the plasma display apparatus becomes larger, it is more difficult to handle the heat radiation sheet. That is, the heat radiation sheet is formed to be thin, for example, with a thickness of 1 mm through 2 mm, thus when the thin heat radiation sheet is adhered to the plasma display panel of larger area, it is difficult to handle the heat radiation sheet. In addition, after adhering the heat radiation sheet to the plasma display panel, an air gap may be generated between the plasma display panel and the heat radiation sheet. When the heat radiation sheet is fabricated using the graphite for high heat conductivity, the above problems become more severe. Therefore, what is needed is a heat radiation sheet structure that is both effective in drawing heat away from the display while being easy to attach and detach from the display.

SUMMARY OF THE INVENTION

It is therefore an object of the present invention to provide an improved structure to draw heat away from the plasma display.

It is also an object of the present invention to provide a plasma display apparatus with improved heat dissipation characteristics.

It is further an object of the present invention to provide a plasma display panel with an improved heat radiation sheet structure.

It is still an object of the present invention to provide for a heat radiation sheet structure for large plasma displays that allow for easy attachment to and detachment from the plasma display panel.

It is also an object of the present invention to provide a heat radiation sheet structure that is not apt to form air gaps between the heat radiation sheet and the plasma display panel.

It is further an object of the present invention to provide a heat dissipation structure that is both effective at drawing heat away from a plasma display but also is easy to attach and detach from the display and does not crack easily.

These and other objects can be achieved by a plasma display apparatus that includes a heat radiation sheet that can be easily adhered to and separated from a plasma display panel and has improved adherence with the plasma display panel and a chassis base. The plasma display apparatus that does not generate a residual image by using a heat radiation sheet, which is easy to handle. The plasma display apparatus includes a heat radiation sheet between a plasma display panel and a chassis base. The heat radiation sheet is divided into two or more sheets called sub-sheets or divided sheets.

According to another aspect of the present invention, there is provided a plasma display apparatus having a heat radiation sheet between a plasma display panel and a chassis base. The heat radiation sheet is located on a discharging region of the plasma display panel, a non-discharging region is located at edges of the discharging region, and a predetermined interval is maintained between the heat radiation sheet and a boundary of the discharging region and the non-discharging region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
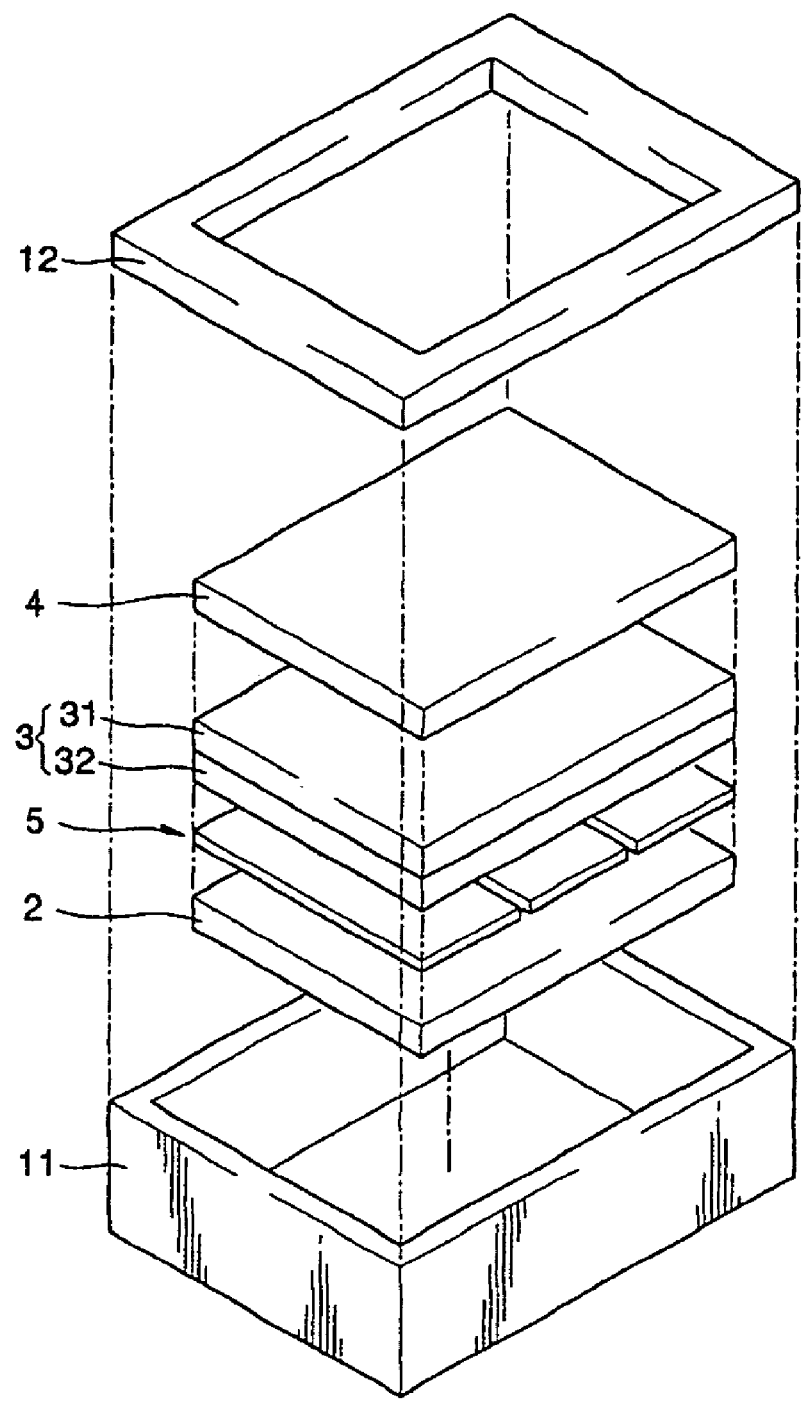
FIG. 1 is an exploded perspective view illustrating a structure of a plasma display apparatus according to the present invention.
Figure 2:
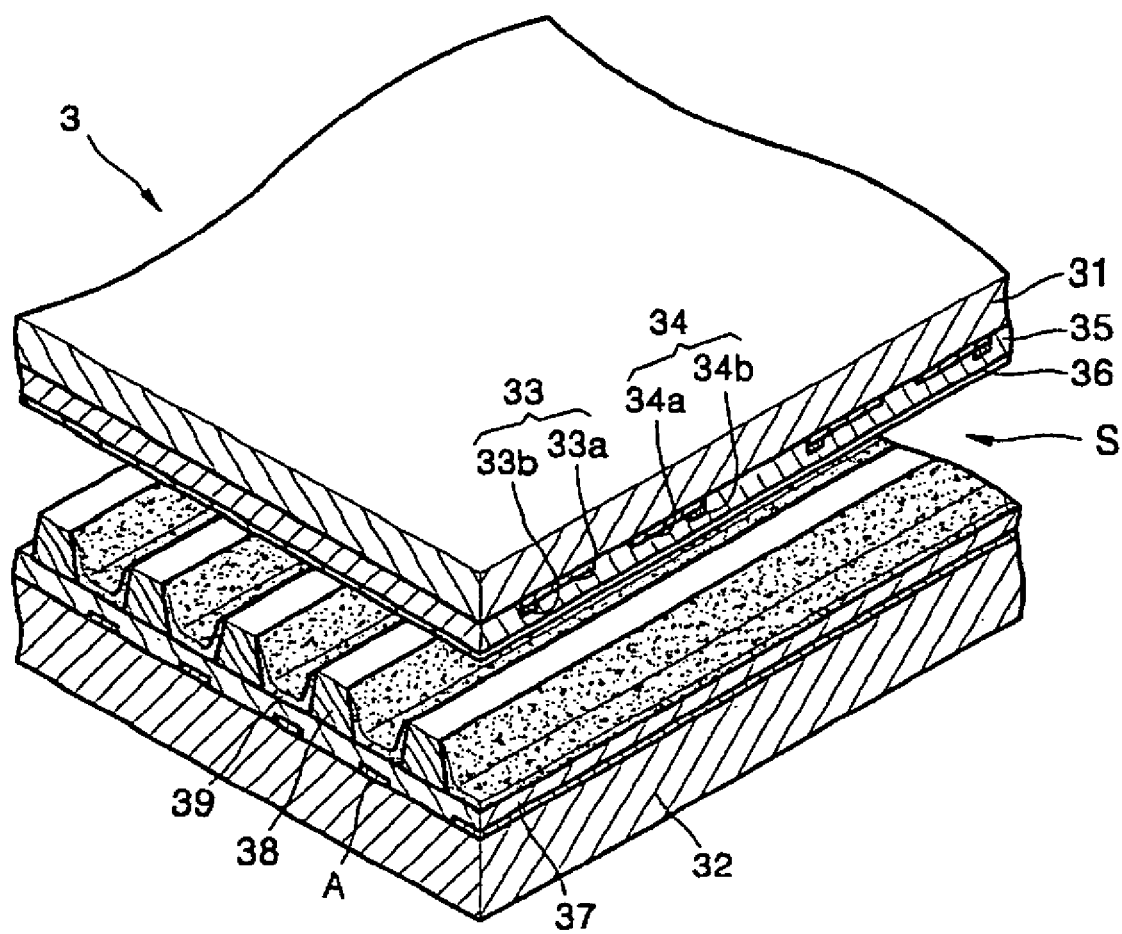
FIG. 2 is a perspective view illustrating a structure of a plasma display panel of FIG. 1.

Turning now to the figures, FIG. 1 is an exploded perspective view illustrating a plasma display apparatus 10 according to the present invention, and FIG. 2 is a partial perspective view illustrating a structure of plasma display panel (PDP) 3 illustrated in FIG. 1. Referring to FIG. 1, the plasma display apparatus 10 of the present invention includes a plasma display panel (PDP) 3, and a chassis base 2 that fixes to the plasma display panel 3, the chassis base 2 including a plurality of electronic elements. The (PDP) 3 and the chassis base 2 are received in a rear case 11, and a front case 12 is assembled to the rear case 11 from the front of the panel 3. A filter member 4 for shielding off an electromagnetic force or ultraviolet rays is further disposed between the panel 3 and the front case 12.

Referring to FIG. 2, the plasma display panel (PDP) 3 mounted on the plasma display apparatus 10 includes a front substrate 31 and a back substrate 32 that face each other, and discharging gas such as Ne or Xe filled between the front substrate 31 and the back substrate 32. Edges of the substrates 31 and 32 are sealed by a sealing member (not illustrated) such as flit glass.

The PDP 3 includes the front substrate 31 and the back substrate 32 facing each other. Address electrodes A are formed in a predetermined pattern on the back substrate 32, and a dielectric layer 37 is formed to cover the address electrodes A. Barrier ribs 38 are formed on the dielectric layer 37 and serve to maintain distance between the front and back substrates 31 and 32 and also to serve to prevent electric and optic cross talk between neighboring pixels formed on the dielectric layer 37 between the barrier ribs 38. A phosphor layer 39 is formed on at least a side of the discharging space that is defined by the barrier ribs 38 and the dielectric layer 37.

Pairs of X electrodes 33 and Y electrodes 34 of predetermined patterns that cross the address electrodes A are disposed on the front substrate 31. Each pair of the X electrodes 33 and the Y electrodes 34 includes transparent electrodes 33a and 34a and bus electrodes 33b and 34b. A point where the X electrode 33, the Y electrode 34, and the address electrode A cross each other forms a cell.

A dielectric layer 35, in which the X electrodes 33 and the Y electrodes 34 are buried, is formed on a lower surface of the front substrate 31, and an MgO layer 36 is formed on the dielectric layer 35. A predetermined gas is filled in the discharge space S that is defined by the front substrate 31 and the back substrate 32.

In the PDP 3 described above, when a voltage is applied to the address electrode A, and one of the X electrode 33 and the Y electrode 34, address discharging occurs between the electrodes and a charged particle is formed on the lower surface of the dielectric layer 35 (strictly speaking, on a lower surface of the MgO layer 36). A sustain discharging operation occurs in that state on the surface of the dielectric layer 35 of the front substrate 31 when a predetermined voltage is applied between the X electrode 33 and the Y electrode 34 of the corresponding cell. Here, the plasma is formed in the gas, and the ultraviolet ray generated by the plasma excites the phosphor in phosphor layer 39 to form visible light in a pixel. In the PDP 3, a black stripe may be formed between the pairs of X and Y electrodes as a black isolator to improve the contrast of the PDP 3. The PDP 3 is not limited to the above structure, and the present invention can be applied to all types of plasma display panels.

As illustrated in FIG. 1, the chassis base 2 is coupled to the back substrate 32 of the PDP 3. The chassis base 2 includes a plurality of electric elements (not illustrated) for driving the PDP 3, and is fabricated using a thermal conductive material such as aluminum to radiate the heat of the PDP 3. A highly thermal conductive heat radiation sheet 5 is further disposed between the chassis base 2 and the PDP 3 to improve the heat radiating function of the PDP 3. The heat radiation sheet 5 is adhered to the back substrate 32 of the PDP 3.

Figure 3:
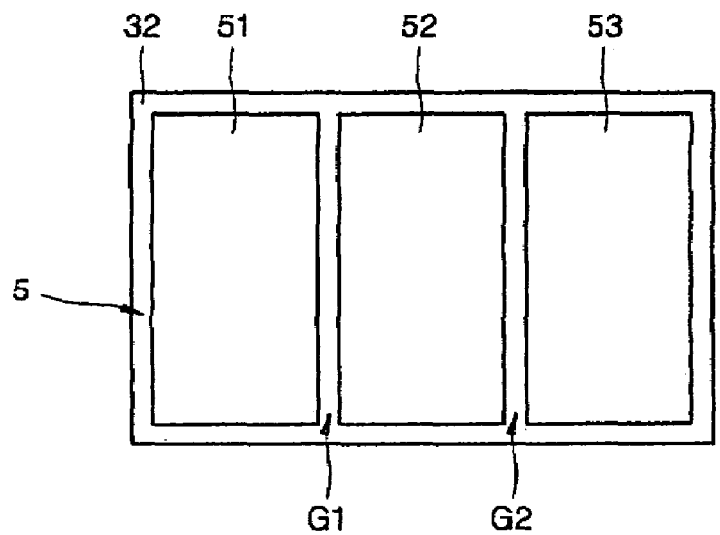
FIG. 3 is a plane view illustrating the plasma display panel of FIG. 1, on which a heat radiation sheet is adhered.

In the preferred embodiment of the present invention, the heat radiation sheet 5 may be divided into at least two parts (or sub-sheets) as illustrated in FIG. 3. Referring to FIG. 3, the heat radiation sheet 5 includes first through third divided heat radiation sub-sheets 51, 52, and 53, however, the number of divided heat radiation sheets is not limited thereto. The number of smaller sub-sheets that make up heat radiation sheet 5 can be set to various numbers according to the entire area of the PDP 3. The direction in which the sub-sheets are divided is illustrated in a width direction but can instead be divided in other directions as well.

The present invention takes advantage of the principle that smaller heat radiation sub-sheets are easier to attach to and detach from the PDP 3 are less apt to crack, and are less apt to form an air gap between the PDP 3 and the heat radiation sheet than if one large heat radiating sheet were used. Thus, in a large plasma display, the present invention contemplates using several smaller heat radiating sub-sheets instead of one large heat radiating sheet to draw heat away from a functioning display. Since the heat radiation sheet 5 is divided, the heat radiation sub-sheet can be adhered easily to a PDP of larger area, and accordingly, an air gap is not generated between the PDP and the heat radiation sub-sheet. It is desirable that the divided sub-sheets of the heat radiation sheet 5 are closely adhered to each other so that there is no gap between the divided sheets. If there is a gap between the divided heat radiation sub-sheets, the ability to draw heat away from the PDP reduces, possibly leading to a visible residual image.

However, it is very difficult to adhere the heat radiation sub-sheets closely in actual process, thus lowering operational efficiency and productivity. Therefore, gaps G1 and G2 of predetermined distances may be disposed between the heat radiation sub-sheets, as illustrated in FIG. 3.

Figure 4:
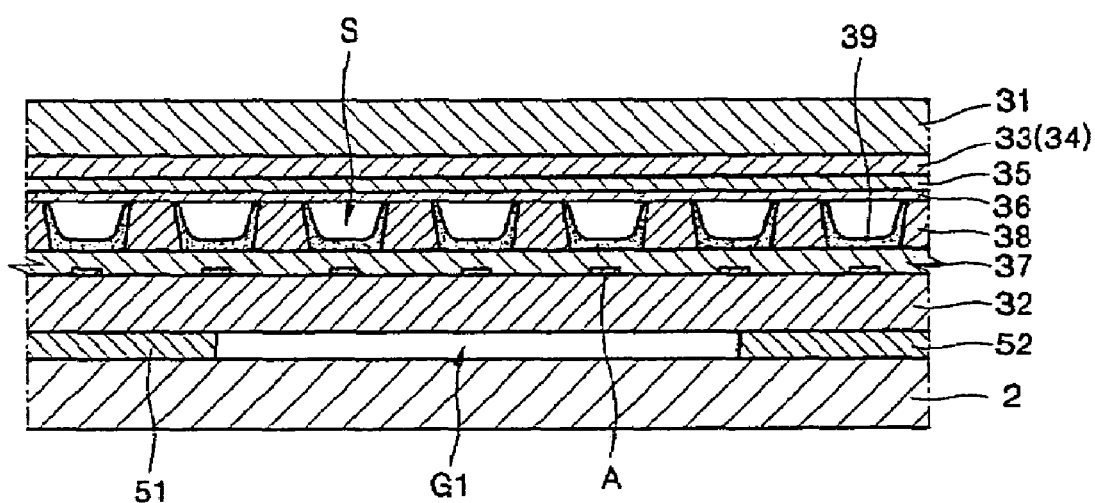
FIG. 4 is an expanded cross-sectional view illustrating a part of FIG. 1.

As illustrated in FIG. 4, heat of portions of the PDP corresponding to the gaps G1 and G2 can not be radiated well, and a visible, residual image may appear. However, widths of the gaps G1 and G2 can be controlled in order to prevent the generation of visible residual images.

The residual image refers to a phenomenon where a previous image remains on the screen when a subsequent image is being displayed. The residual image can be caused by various factors. One of the most important factors causing the residual image is a temperature difference. That is, the temperature difference between the region on which the image is displayed and the discharge occurs, and the region on which the image is not displayed and the discharge does not occur causes the residual image phenomenon.

The presence of residual image is tested in the following way. First (a), the entire PDP emits white light (full-white) for 20 minutes. Then, (b) a predetermined pattern (about 3% of the entire screen) emits the light again for 10 minutes. This predetermined region will be the gap and/or the interval region. Then, after steps (a) and (b), the entire panel emits the full-white light again (step c). A brightness of the predetermined region that emitted the light for last 10 minutes is lower than that of the other regions, and thus the color coordinates of the two regions are not same. Here, the brightness difference between the display region and non-display region at 30 seconds after the screen is transformed to full-white is measured (step d), and the time in excess of 30 seconds of full-white when the residual image disappears is defined as residual image disappearance time (step e). In other words, the full-white is extended beyond the 30 seconds in order to measure the residual image disappearance time. This residual image disappearance time is the time min excess of 30 seconds of full-white that is needed for the brightness difference between the display and the non-display regions to fall to a difference that is no longer detectable by the human eye (i.e., fall to a brightness difference of 7 cd/m$^2$). In addition, the brightness difference when the residual image disappears is defined as residual image brightness difference.

As described above, when the brightness difference between the predetermined image display region and the other regions becomes larger, the residual image disappearance time also becomes longer. Thus, it is desirable that the brightness difference be as small as possible. If the brightness difference is larger than 7 cd/m$^2$, the residual image is visible by a user seeing the plasma display apparatus, and if the brightness difference is 7 cd/m$^2$ or less, the residual image is hardly visible by the user. Therefore, the residual image disappearance time is the full-white time after the 30 seconds in step d required for the brightness difference to fall to 7 cd/m$^2$.

In order to reduce the brightness difference, a heat radiation sheet is generally adhered to the PDP to make the heat radiation uniform throughout the entire PDP and improve the heat radiation function of the PDP. In the present invention, the uneven heat radiation caused by the gaps that are generated when the divided heat radiation sub-sheets are adhered to the PDP can be solved by controlling the widths of the gaps between the sub-sheets.

As illustrated in FIG. 4, the heat radiated from the back substrate 32 is transmitted to the chassis base 2 through the heat radiation sub-sheets 51 and 52. However, since an air layer that has low thermal conductivity exists in the gap G1 between sub-sheets 51 and 52, the thermal conductivity is lower at gap G1 than at the sub-sheets 51 and 52. Thus, the heat radiated to the gap G1 is transmitted to the chassis base 2 through the heat radiation sub-sheets 51 and 52 that are adjacent to the gap G1. Here, some of the heat that cannot be transmitted to the adjacent heat radiation sub-sheets 51 and 52 remains on the panel thus promoting degradation of the phosphor and causing a residual image on the panel at a portion of the panel near the gap G1. Therefore, the uneven heat radiation caused by the gaps that are generated when the divided heat radiation sheets are adhered to the panel is solved by controlling the widths of the gaps in the present invention.

As illustrated in FIG. 3, widths of the first gap G1 and the second gap G2 between the first through third heat radiation sub-sheets 51, 52, and 53 that are adhered to the back substrate 32 are controlled so that the brightness difference between portions of the PDP that correspond to the gaps and portions of PDP that do not correspond to the gaps G1 and G2 can be 7 cd/m$^2$ or less.

Empirical results in which the width of the gap was varied to find the brightness differences at step d between the portions corresponding to the gaps and the portions not corresponding to the gaps are illustrated in Tables 1 and 2. For the results in Table 1, graphite group heat radiation sub-sheets were employed that have a very high thermal conductivity of 240 W/m·K, the gaps running in a transverse direction and three sub-sheets were employed as illustrated in FIG. 3. The divided heat radiation sub-sheets are adhered to the back substrate 32 of the PDP 3 and the chassis base is coupled to the PDP to obtain the residual image experimental results. The residual image experiment is performed in above described way, that is, the PDP emits the light of full-white for 20 minutes, the portions corresponding to the gaps G1 and G2 emit the light again for 10 minutes. Then, the full-white mode is displayed again, and brightness of the portion (A) of FIG. 5, on which the heat radiation sub-sheets 51, 52, and 53 are adhered, and the portion (B) of FIG. 5, on which the gaps G1 and G2 are positioned, is measured.

TABLE 1

| | | Gap(mm) | | | | | | | | | | | | | | |
|---|---|---|---|---|---|---|---|---|---|---|---|---|---|---|---|---|
| | | 3 | 6 | 9 | 12 | 15 | 18 | 21 | 24 | 27 | 30 | 33 | 36 | 37 | 38 | 40 |
| Brightness | A | 75.6 | 75.6 | 75.6 | 75.6 | 75.6 | 75.6 | 75.6 | 75.6 | 75.6 | 75.6 | 75.6 | 75.6 | 75.6 | 75.6 | 75.6 |
| (cd/m$^2$) | B | 75.4 | 74.7 | 74.3 | 73.8 | 73.8 | 72.7 | 75.2 | 71.5 | 70.9 | 70.1 | 69.6 | 68.9 | 68.6 | 68.4 | 68.0 |
| Brightness difference | | 0.2 | 0.9 | 1.3 | 1.8 | 2.3 | 2.9 | 3.4 | 4.1 | 4.7 | 5.5 | 6.0 | 6.7 | 7.0 | 7.2 | 7.6 |

As illustrated in Table 1, when the widths of the gaps G1 and G2 are 37 mm or less, the brightness difference becomes 7 cd/m² or less, and thus the user cannot perceive the residual image.

Next, Table 2 illustrates the residual image empirical results obtained by adhering silicon group heat radiation sub-sheets having the thermal conductivity of about 1.2 W/m·K to the PDP 3 as described in conjunction with Table 1.

TABLE 2

| | Gap(mm) | | | | | | | | | | | | |
|---|---|---|---|---|---|---|---|---|---|---|---|---|---|
| | 3 | 6 | 9 | 12 | 15 | 18 | 21 | 24 | 28 | 29 | 30 | 31 | 32 |
| Brightness A (cd/m²) | 74.8 | 74.8 | 74.8 | 74.8 | 74.8 | 74.8 | 74.8 | 74.8 | 74.8 | 74.8 | 74.8 | 74.8 | 74.8 |
| B | 74.4 | 73.8 | 73.1 | 72.4 | 71.7 | 71.0 | 70.3 | 69.5 | 68.4 | 68.1 | 67.8 | 67.6 | 67.2 |
| Brightness difference | 0.4 | 1.0 | 1.7 | 2.4 | 3.1 | 3.8 | 4.5 | 5.3 | 6.4 | 6.7 | 7.0 | 7.2 | 7.6 |

According to Table 2, when the widths of the gaps G1 and G2 is 30 mm or less, the brightness difference of two regions becomes 7 cd/m² or less, and the user cannot perceive the residual image.

Tables 1 and 2 illustrate empirical results with respect to the graphite heat radiation sheet having the highest thermal conductivity and the silicon heat radiation sheet having a relatively low thermal conductivity. Because the threshold gap size for the heat radiation sheets made of different materials with different coefficients varies very little, it can readily be concluded that the material used for the heat radiation sub-sheets has little effect on the threshold gap width. Therefore, in a case where the heat radiation sheets are manufactured using some other material, such as aluminum (Al) or copper (Cu) that has the thermal conductivity between that of the graphite and the silicon heat radiation sub-sheets, it can be deduced that the threshold gap width where the brightness difference is 7 cd/m² is somewhere between 30 and 37 mm. Thus, if such a material is used for the heat radiation sub-sheets, the gap width must not exceed the 30 to 37 mm range if a visible residual image is to be prevented.

As illustrated in FIG. 4, since the air layer exists between the back substrate 32 and the chassis base 2 at the location of the gap G1, an adhesive tape (not illustrated) may be inserted into the gaps G1 and G2 to improve the adhesive force.

In the above description, the heat radiation sheet is attached to the back substrate of the PDP 3, however, the heat radiation sheet may be attached to the chassis base 2 first, and then, the back substrate 32 may be attached to the chassis base 2.

Figure 5:
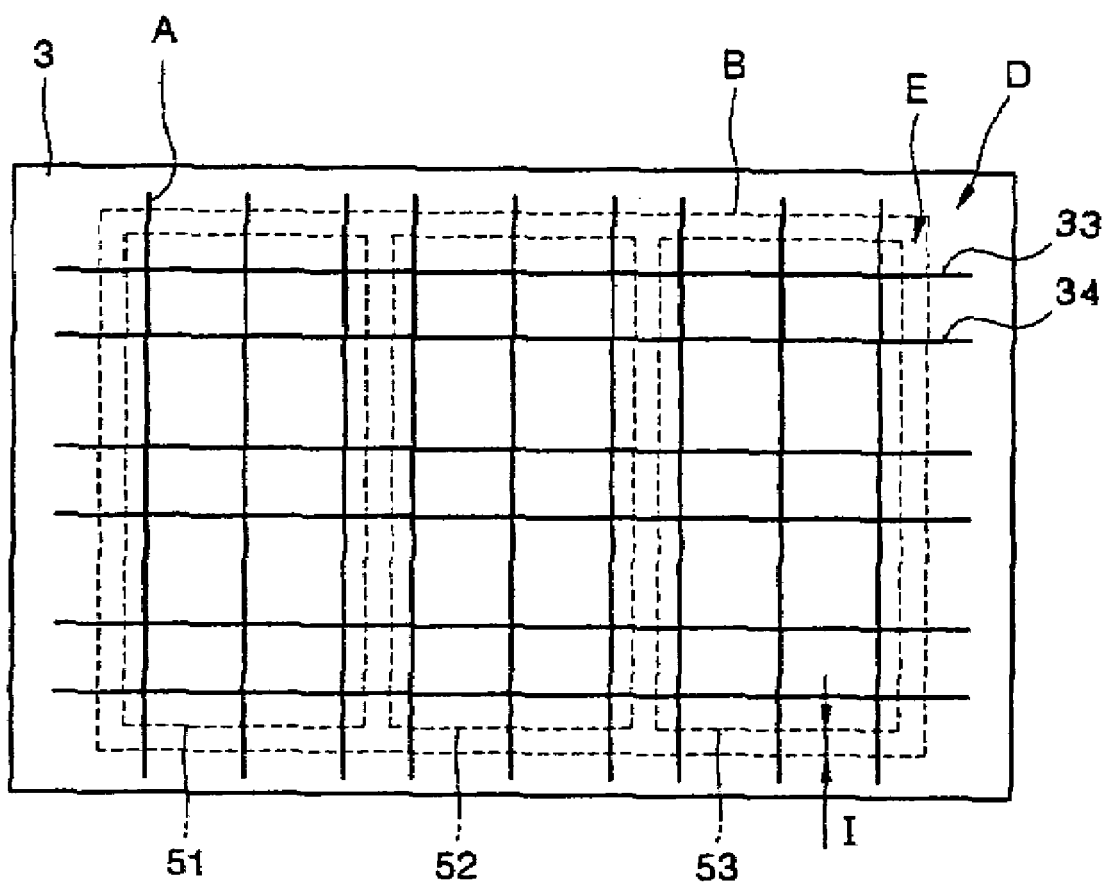
FIG. 5 is a schematic diagram illustrating a discharging region and a non-discharging region of the plasma display panel.

Referring now to FIG. 5, FIG. 5 schematically illustrates a discharging region E and a non-discharging region D on the PDP 3. A boundary B marks the edge of discharging region E where discharging region E meets non-discharging region D. As illustrated in FIG. 5, pairs of the X electrodes 33 and Y electrodes 34 are arranged on the PDP 3, and a plurality of address electrodes A cross the X and Y electrodes 33 and 34 inside discharging region E.

The discharging region E is the region where the X and Y electrodes 33 and 34 and the address electrode A cross each other to make the discharging operation occur, and the non-discharging region D is located along the edge (or periphery or perimeter) of PDP 3 outside the discharging region E.

It is desirable that the heat radiation sub-sheets 51, 52, and 53 are located in the discharging region E of PDP 3. Alternatively, the heat radiation sub-sheets 51, 52, and 53 may be attached to correspond the boundary B between the discharging region E and the non-discharging region D, or to reach the non-discharging region D over the boundary B.

However, it is difficult to handle the heat radiation sheet, especially when they are very large in size, since the heat radiation sheets are thin plates, thus it is desirable to use several small heat radiation sub-sheets instead of one large heat radiation sheet, especially when the PDP 3 has a large display area.

As illustrated in FIG. 5, the heat radiation sub-sheets 51, 52, and 53 can be attached so that the furthermost edges of the heat radiation sub-sheets 51, 52, and 53 are spaced a predetermined interval I from the boundary B between the discharging region E and the non-discharging region D. Here, since the interval I is inside in the discharging region E, a visible, residual image may be generated due to lower heat radiation capabilities in the interval I portion.

Therefore, the width interval I should be designed so that a visible, residual image is not generated. That is, the brightness difference between the portion of PDP 3 where the interval I is located and the portion of PDP 3 in contact with a heat radiation sub-sheet should be 7 cd/m² or less. In view of Tables 1 and 2 indicating that heat radiation sheets should not have a gap therebetween of more than 30 to 37 mm, the interval I should also be limited also to have a width not to exceed the 30 mm through 37 mm range. This range applies when the heat radiation sheets are made out of silicon having low thermal conductivity, or aluminum, copper, or graphite sheets having higher thermal conductivities.

After disposing the heat radiation sub-sheets 51, 52, and 53 on the inner part of the boundary B within the discharging region E, an adhesive tape (not illustrated) may be further adhered on the heat radiation sub-sheets to prevent the adhesive force between the panel 3 and the chassis base 2 from delaminating.

The above described arrangements of heat radiation sheets in which there is an interval I between the heat radiation sub-sheets and the boundary B between the discharging region E and the non-discharging region D is not limited to the scenario where many relatively small heat radiation sub-sheets are employed, but also applies to the scenario where only one large heat radiation sheet is applied to the back side of PDP 3. It is desirable that the size of the heat radiation sheet is small even when one heat radiation sheet is used, and it is also desirable that the interval I be less than 30 to 37 mm. Here, since the interval I should be controlled so that the brightness difference in step d between two portions is 7 cd/m² or less, the interval I is controlled so that it does not exceed the range of 30 mm through 37 mm. In addition, the adhesive tape may be further adhered to outer surface of the heat radiation sheet to improve the adhesive force.

Since adhesive tape has a higher thermal conductivity than air, adhesive tape can also be applied within interval I to both improve the heat dissipation characteristics while improving adhesion.

According to the present invention, the heat radiation sheet on the PDP is divided into several sub-sheets so that the heat radiation sub-sheets can be attached and separated easily to and from the PDP and so the adherence between the heat radiation sub-sheets and the display panel can be improved. In addition, air gap generation between the heat radiation sub-sheets and the plasma display panel can be prevented. By doing so, a visible residual image does not appear even though the heat radiation sheet is divided.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. An apparatus, comprising:
a plasma display panel;
a chassis base attached to the plasma display panel; and
a heat radiation sheet arranged between the plasma display panel and the chassis base, the heat radiation sheet comprising at least two separate sub-sheets, the sub-sheets being separated by a gap of a predetermined width, the width of the gap being maintained so that a visible residual image does not appear at a portion of the plasma display panel corresponding to the gap, a maximum width of the gap being less than 37 mm.

2. The apparatus of claim 1, the width of the gap being sufficiently narrow so that a residual image brightness difference between a portion of plasma display panel that corresponds to the gap and a portion of the plasma display panel that does not correspond to the gap is less than 7 $cd/m^2$.

3. The apparatus of claim 1, the maximum width of the gap is more than 30 mm.

4. The apparatus of claim 1, a non-discharging region of the plasma display panel being arranged at a periphery of the plasma display panel and surrounding a discharging region of the plasma display panel, a boundary being arranged where the discharging and non-discharging regions meet, an interval having a predetermined width being arranged between the heat radiation sub-sheets and the boundary between the discharging region and the non-discharging region of the plasma display panel.

5. The apparatus of claim 4, comprised of the width of the interval being maintained so that a visible residual image does not appear at a portion of plasma display panel that corresponds to the interval.

6. The apparatus of claim 5, comprising the width of the interval accommodating a residual image brightness difference between a portion of plasma display panel that corresponds to the interval and the portion of plasma display panel that corresponds to one of said heat radiation sub-sheets, is 7 $cd/m^2$ or less.

7. The apparatus of claim 4, comprising a maximum width of the interval being in a range of 30 mm through 37 mm.

8. The apparatus of claim 4, further comprising an adhesive tape arranged on an outer side of the heat radiation sub-sheet.

9. The apparatus of claim 4, further comprising an adhesive tape that is adhered to the plasma display panel and is arranged on at least one of the gap and the interval.

10. An apparatus, comprising:
a plasma display panel;
a chassis base attached to one side of the plasma display panel; and
a heat radiation sheet arranged between the plasma display panel and the chassis base, the heat radiation sheet being arranged on a discharging region of the plasma display panel, a non-discharging region of the plasma display panel being arranged at an outside of the discharging region, an interval having a width being arranged between the heat radiation sheet and a boundary separating the discharging region from the non-discharging region of the plasma display panel.

11. The apparatus of claim 10, the size of the width of the interval being arranged so that a visible residual image does not appear at the portion of plasma display panel that corresponds to the interval.

12. The apparatus of claim 10, comprised of the width of the interval accommodating a residual image brightness difference between a portion of plasma display panel that corresponds to the interval and a portion of plasma display panel that does not correspond to the interval is 7 $cd/m^2$ or less.

13. The apparatus of claim 10, comprised of a maximum width of the interval being in a range of 30 mm through 37 mm.

14. The apparatus of claim 10, further comprising an adhesive tape arranged on an outer side of the heat radiation sheet.

15. An apparatus, comprising:
a plasma display panel;
a chassis base attached to the plasma display panel; and
a plurality of heat radiation sheets arranged between the chassis base and the plasma display panel, each of the heat radiation sheets being separated from each other by a gap whose width is sufficiently small so that no visible residual image can form in a portion of the plasma display panel corresponding to the gap, wherein the width of the gap is sufficiently narrow so that a residual image brightness difference between a portion of plasma display panel that corresponds to the gap and a portion of the plasma display panel that does not correspond to the gap is less than 7 $cd/m^2$.

16. The apparatus of claim 15, each of the plurality of heat radiation sheets being between 1 and 2 mm thick, each heat radiation sheet comprising graphite and having a thermal conductivity of 240 W/m·K.

17. The apparatus of claim 15, each of the plurality of heat radiation sheets comprising silicon and having a thermal conductivity of 1.2 W/m·K and being between 1 and 2 mm thick.

18. The apparatus of claim 15, the plasma display panel comprising a display portion and a non-display portion surrounding the display portion, each of the heat radiation sheets being arranged in the display portion of the plasma display panel, none of the heat radiation sheets being in the non-display portion of the plasma display panel, edges of the heat radiation sheets being no more than 37 mm from the non-display portion of the plasma display panel.

19. The apparatus of claim 18, further comprising an adhesive tape adhered to the plasma display panel and is arranged on at least one of the gap and an interval between the edges of the heat radiation sheets and the non-display portion of the plasma display panel.

20. The apparatus of claim 15, a maximum width of the gap is in a range of 30 mm through 37 mm.

* * * * *